(12) United States Patent
Cho et al.

(10) Patent No.: US 7,851,350 B2
(45) Date of Patent: Dec. 14, 2010

(54) SEMICONDUCTOR DEVICE AND METHOD OF FORMING CONTACT PLUG OF SEMICONDUCTOR DEVICE

(75) Inventors: Whee Won Cho, Cheongju-si (KR); Jung Geun Kim, Seoul (KR); Eun Soo Kim, Incheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 292 days.

(21) Appl. No.: 11/965,368

(22) Filed: Dec. 27, 2007

(65) Prior Publication Data

US 2009/0098732 A1 Apr. 16, 2009

(30) Foreign Application Priority Data

Oct. 10, 2007 (KR) ...................... 10-2007-0102113

(51) Int. Cl.
*H01L 21/4763* (2006.01)
(52) U.S. Cl. ...................... 438/622; 438/637; 438/639; 257/E21.577
(58) Field of Classification Search .................. 438/675, 438/622, 637, 638, 639; 257/E21.577
See application file for complete search history.

(56) References Cited

U.S. PATENT DOCUMENTS

| | | | | |
|---|---|---|---|---|
| 6,071,812 A * | 6/2000 | Hsu et al. | ................... | 438/668 |
| 6,541,333 B2 * | 4/2003 | Shukuri et al. | .............. | 438/243 |
| 6,645,867 B2 * | 11/2003 | Dokumaci et al. | .......... | 438/700 |
| 6,727,144 B2 * | 4/2004 | Hashimoto | ................... | 438/257 |
| 7,122,463 B2 * | 10/2006 | Ohuchi | ....................... | 438/624 |
| 2002/0020883 A1 * | 2/2002 | Dennison | .................... | 257/368 |
| 2006/0001104 A1 * | 1/2006 | Ookura | ....................... | 257/368 |
| 2006/0211216 A1 * | 9/2006 | Sandhu et al. | .............. | 438/445 |

FOREIGN PATENT DOCUMENTS

| KR | 1019960005249 B1 | 4/1996 |
|---|---|---|
| KR | 100718794 B1 | 5/2007 |

* cited by examiner

*Primary Examiner*—Michael Trinh
(74) *Attorney, Agent, or Firm*—Townsend and Townsend and Crew LLP

(57) ABSTRACT

The present invention relates to a semiconductor device and a method of forming a contact plug of a semiconductor device. According to the method, a first dielectric layer is formed on a semiconductor substrate in which junction regions are formed. A hard mask is formed on the first dielectric layer. The hard mask and the first dielectric layer corresponding to the junction regions are etched to form trenches. Spacers are formed on sidewalls of the trenches. Contact holes are formed in the first dielectric layer using an etch process employing the spacers and the hard mask so that the junction regions are exposed. The contact holes are gap filled with a conductive material, thus forming contact plugs. Accordingly, bit lines can be easily formed on the contact plugs formed at narrow spaces with a high density.

18 Claims, 4 Drawing Sheets

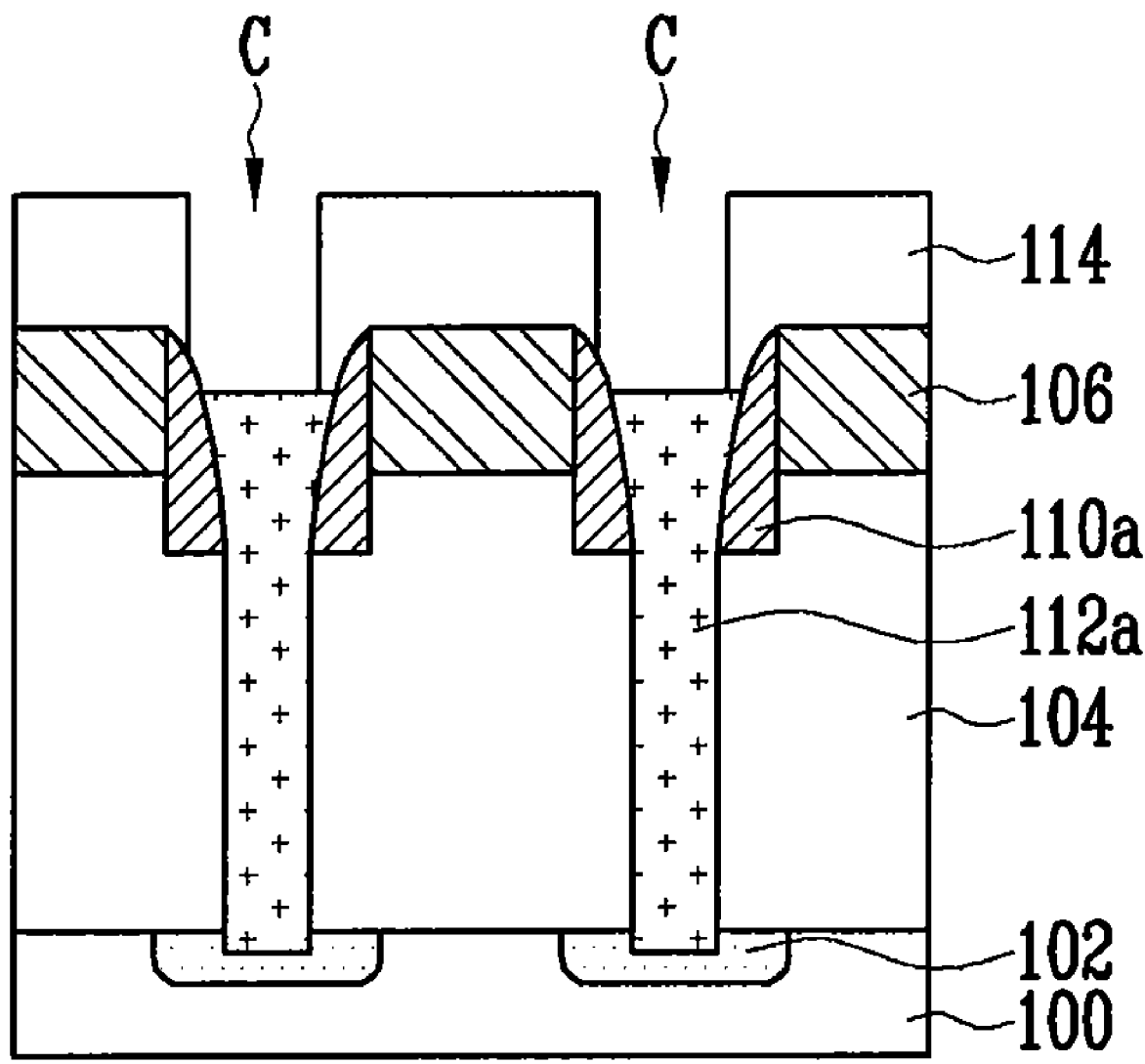

SEMICONDUCTOR DEVICE AND METHOD OF FORMING CONTACT PLUG OF SEMICONDUCTOR DEVICE

CROSS-REFERENCES TO RELATED APPLICATIONS

The present application claims priority to Korean patent application number 10-2007-102113, filed on Oct. 10, 2007, which is incorporated by reference in its entirety.

BACKGROUND OF THE INVENTION

The present invention relates to a semiconductor device and more particularly to a method of forming a contact plug in a NAND flash memory device.

In general, semiconductor memory devices can be classified into volatile memory devices and nonvolatile memory devices. The volatile memory devices include memory devices, such as Dynamic Random Access Memory (DRAM) and Static Random Access Memory (SRAM), in which the data speed is fast, but data stored therein is lost when power is switched off. In contrast, the nonvolatile memory devices include memory devices in which data stored therein is retained although power is switched off.

A flash memory device is a type of nonvolatile memory device and is a highly-integrated memory device, which was developed by combining the advantages of Erasable Programmable Read Only Memory (EPROM) which can be programmed and erased and Electrically Erasable Programmable Read Only Memory (EEPROM) which can be electrically programmed and erased.

Flash memory devices can be classified into a NOR type flash memory device and a NAND type flash memory device depending on a structure of a cell and operation conditions. In the NOR type flash memory device, a drain of each memory cell transistor is connected to a bit line. Thus, the NOR type flash memory device enables program and erase with respect to a predetermined address and therefore has a fast operating speed. Accordingly, the NOR type flash memory device has generally been used in application fields requiring a high-speed operation. In contrast, in the NAND type flash memory device, a plurality of memory cell transistors are connected in series to form one string. One string is connected between bit lines and a common source line. Thus, the number of drain contact plugs is relatively small, enabling higher integration. Accordingly, the NAND type flash memory device has generally been used in application fields requiring high-capacity data retention.

The NAND type nonvolatile memory device has a plurality of word lines formed between a source select line and a drain select line. Gates of select transistors respectively included in the plurality of strings are interconnected to form the select line, such as the source select line or the drain select line, and gates of memory cell transistors respectively included in the plurality of strings are interconnected to form the word lines. A tunnel oxide layer, a floating gate, a dielectric layer and a control gate are included in the select line and the word lines. In the select line, the floating gate and the control gate are electrically connected. A junction region is formed between the select line and the word lines. At this time, a junction region between the source select lines becomes a source region, and a junction region between the drain select lines becomes a drain region.

A spacer and a Self Align Contact (SAC) nitride film for protecting the sides of the select lines and the word lines are formed on the sides of the select lines and the word lines. A dielectric layer is formed on the entire surface of the select lines and the word lines. A contact hole through which the junction region between the select lines is exposed is formed in the dielectric layer. The contact hole is gap filled with a conductive material, so a contact plug electrically connected to the junction region is formed.

However, as flash memory devices become highly integrated and miniaturized, a space between the select lines where the source contact plug and the drain contact plug are formed is narrowed. Thus, the size of the source contact plug and the drain contact plug is decreased. Accordingly, it becomes an important issue to form metal lines (e.g., bit lines) and contact plugs so that miss alignment between the metal lines and the contact plugs are not generated.

BRIEF SUMMARY OF THE INVENTION

According to the present invention, spacers are formed on sidewalls of trenches formed in a dielectric layer, contact holes are formed in the dielectric layer by employing the spacers, and contact plugs are formed in the contact holes. Accordingly, the contact plug having a top width wider than a bottom width can be formed. Thus, when a trench through which the contact plug is exposed is formed in the dielectric layer formed on the contact plug and a metal line is formed in the trench, process margin of the metal line can be increased due to the contact plug having a relatively wide top width. Further, since the trench is formed through self-alignment up to the top surface of the contact plug along the spacer, a problem of miss alignment between bit lines formed in the trench and the contact plug can be prevented.

A method of forming a contact plug of a semiconductor device according to an embodiment of the present invention includes forming a first dielectric layer on a semiconductor substrate in which junction regions are formed, forming a hard mask on the first dielectric layer, etching the hard mask and the first dielectric layer corresponding to the junction regions, thus forming trenches, forming spacers on sidewalls of the trenches, forming contact holes in the first dielectric layer using an etch process employing the spacers and the hard mask so that the junction regions are exposed, and gap filling the contact holes with a conductive material, thus forming contact plugs.

A bottom width of the spacer may be narrower than a top width of the spacer. The spacer may be formed from a nitride film or a Plasma Enhanced (PE) nitride film. Further, the spacer may be formed using a mixed gas of $SiH_4$ gas, $NH_3$ gas and $N_2$ gas as a source gas in a temperature range of 400 to 600 degrees Celsius under a pressure of 3 to 10 torr using RF power of 300 to 700 W. Alternatively, the spacer may be formed from a Low Pressure (LP) nitride film. The spacer may be formed using a gas in which dichlorosilane gas (DCS) and $NH_3$ gas are mixed in a ratio of 5:1 to 20:1 as a source gas. The spacer may be formed in a temperature range of 600 to 800 degrees Celsius under a pressure of 0.2 to 0.5 torr. The formation of the spacer may include forming a spacer material layer on the hard mask including the trenches, and performing an etch process on the spacer material layer so that the spacer material layer remains only on the trenches sidewalls. The etch process of the spacer material layer may be performed using an anisotropic etch process. The etch process of the spacer material layer may be performed using a mixed gas of Ar gas, $CF_4$ gas and $CHF_3$ gas as an etch gas. The etch process of the spacer material layer may be performed using power of 500 to 2000 W in a temperature range of 0 to 100 degrees Celsius under a pressure of 10 to 100 torr. The contact hole may be formed using a mixed gas of $C_xF_y$-based gas, Ar gas and $O_2$ gas as an etch gas. The contact hole may be formed using power of 1000 to 4000 W in a temperature range of 0 to 100 degrees Celsius under a pressure of 10 to 100 torr. The hard mask may be comprised of a nitride film and an amorphous carbon layer. The amorphous carbon layer may be removed after the contact holes are formed. The method may further include, after the contact plugs are formed, forming a second dielectric layer on the hard mask including the contact plugs, and removing part of the second dielectric layer so that a top of the contact plugs is removed. The contact plug may have a height lower than that of the hard mask. The contact plug may have a height, which is 10 to 500 angstrom lower than that of the hard mask.

A semiconductor device according to another embodiment of the present invention includes junction regions formed in a semiconductor substrate, a dielectric layer formed over the semiconductor substrate and comprising contact holes having its top width wider than its bottom width, spacers formed on upper sidewalls of the contact holes, and contact plugs formed within the contact holes.

The semiconductor device may further include a hard mask formed between the dielectric layer and the semiconductor substrate. The spacers may be formed on sidewalls of the hard mask.

BRIEF DESCRIPTION OF THE DRAWINGS

FIGS. 1A to 1J are sectional views illustrating a semiconductor device and a method of forming a contact plug of the semiconductor device according to the present invention.

DESCRIPTION OF SPECIFIC EMBODIMENTS

A specific embodiment according to the present invention will be described with reference to the accompanying drawings.

Figure 1A:
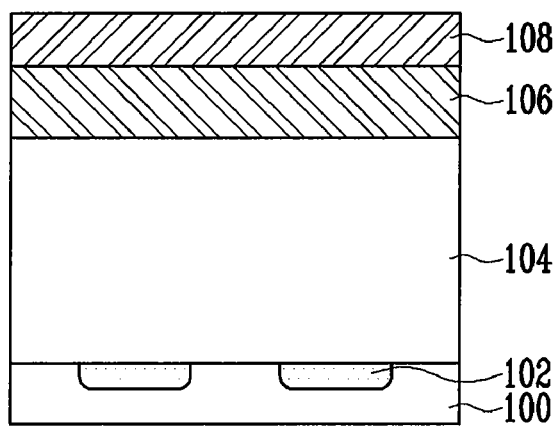

Referring to FIG. 1A, a first dielectric layer 104 is formed over a semiconductor substrate 100 in which a variety of elements, including a gate or a memory cell (not shown), junction regions 102 such as a source region or a drain region, and so on, are formed through a typical process. The first dielectric layer 104 may be formed to a thickness of 8000 to 10000 angstroms using an oxide film. Meanwhile, a buffer layer (not shown) for preventing damage to the semiconductor substrate 100 in a contact hole etch process or an etch-stop layer (not shown) serving as an etch stopper in a contact hole etch process may be further formed between the semiconductor substrate 100 and the first dielectric layer 104.

Hard masks 106, 108 used in a contact hole etch process are formed over the first dielectric layer 104. The hard masks 106, 108 may have a stack structure of a first hard mask 106 and a second hard mask 108. The first hard mask 106 may be formed from a material with an etch selectivity different from that of the first dielectric layer 104, such as a nitride film. The second hard mask 108 may be formed from an amorphous carbon layer that facilitates micro patterning. Meanwhile, a passivation layer (not shown) may be further formed on the amorphous carbon layer. The passivation layer is for protecting the amorphous carbon layer when a photoresist pattern is reformed (i.e., rework process) in a contact hole etch process.

Figure 1B:
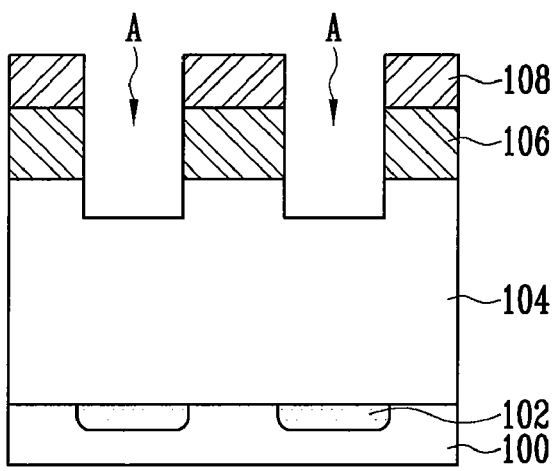

Referring to FIG. 1B, parts of the first hard mask 106 and the second hard mask 108, corresponding to the junction regions 102 formed over the semiconductor substrate 100, are removed and patterned. Thus, parts of the exposed first dielectric layer 104 are exposed to form trenches A. The trench A is formed to provide a step for forming spacers in a subsequent process. The trench A may have a depth of 200 to 2000 angstrom.

Figure 1C:
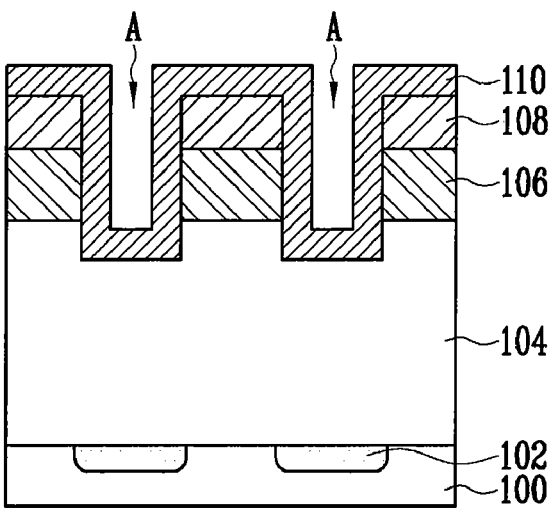

Referring to FIG. 1C, a spacer film 110 is formed on the second hard mask 108 including the trenches A. The spacer film 110 thickness may be formed to the extent that the step formed by the trenches A can be maintained. The spacer film 110 may be formed from materials with an etch selectivity different from that of the first dielectric layer 104, such as a nitride film. When the spacer film 110 is formed from a Plasma Enhanced (PE) nitride film, a mixed gas of $SiH_4$ gas, $NH_3$ gas and $N_2$ gas may be used as a source gas, and a temperature of 400 to 600 degrees Celsius, a pressure of 3 to 10 Torr, and RF power of 300 to 700 W may be used. Further, when the spacer film 110 is formed from a Low Pressure (LP) nitride film, a gas in which dichlorosilane gas (DCS) and $NH_3$ gas are mixed in a ratio of 5:1 to 20:1 may be used as a source gas, and a temperature of 600 to 800 degrees Celsius and a pressure of 0.2 to 0.5 Torr may be used.

Figure 1D:
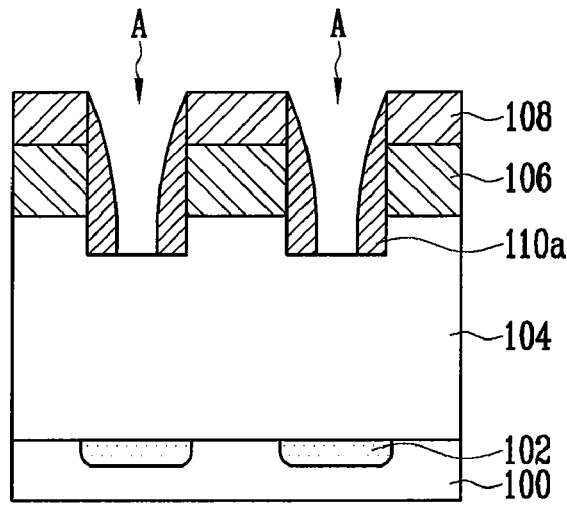

Referring to FIG. 1D, spacers 110a are formed on sidewalls of the trenches A by performing an anisotropic etch process on the spacer film (refer to 110 of FIG. 1C) so that the spacer film remains only on the sidewalls of the trenches A. To this end, the etch process may be performed using a mixed gas of Ar gas, $CF_4$ gas and $CHF_3$ gas as an etch gas in a temperature range of 0 to 100 degrees Celsius under a pressure of 10 to 100 Torr and a power of 500 to 2000 W. At this time, the spacer 110a has a thickness that becomes larger as you go from top to bottom. Thus, the bottom opening of the spacer 110a is narrower than the top opening of the spacer 110a.

Figure 1E:
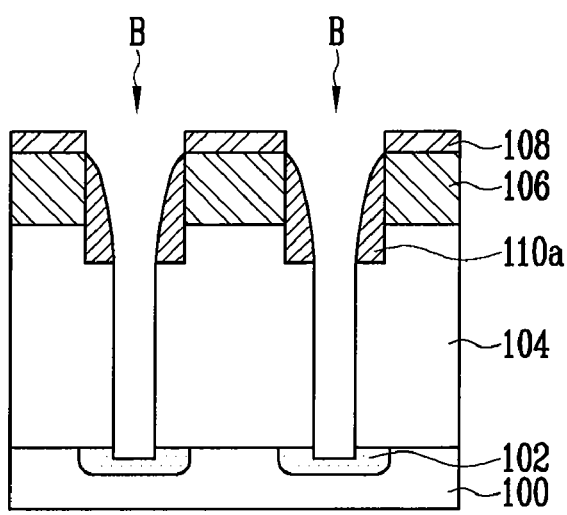

Referring to FIG. 1E, contact holes B are formed by etching the first dielectric layer 104 exposed below the trenches A by an etch process using the spacers 110a, the first hard mask 106 and the second hard mask 108 as an etch mask. To this end, the etch process may be performed using a mixed gas of $C_xF_y$-based gas, Ar gas and $O_2$ gas as an etch gas in a temperature range of 0 to 100 degrees Celsius under a pressure of 10 to 100 Torr and using a power of 1000 to 4000 W. Accordingly, the junction regions 102 formed in the semiconductor substrate 100 are exposed.

The contact hole B has the same width as the bottom opening of the spacer 110a. Further, since the top opening of the spacer 110a is wider than the bottom opening of the spacer 110a, the contact hole B may have a top width wider than a bottom width.

During the etch process for forming the contact hole B, part of the second hard mask 108 may be removed and part of the spacer 110a may also be removed. Therefore, the height of the spacer 110a may be lowered.

Figure 1F:
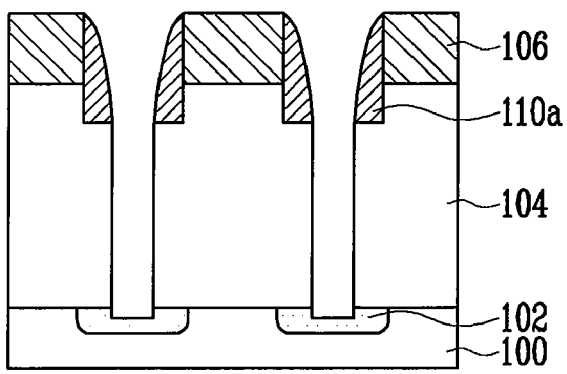

Referring to FIG. 1F, the remaining second hard mask (refer to 108 of FIG. 1E) is removed.

Figure 1G:
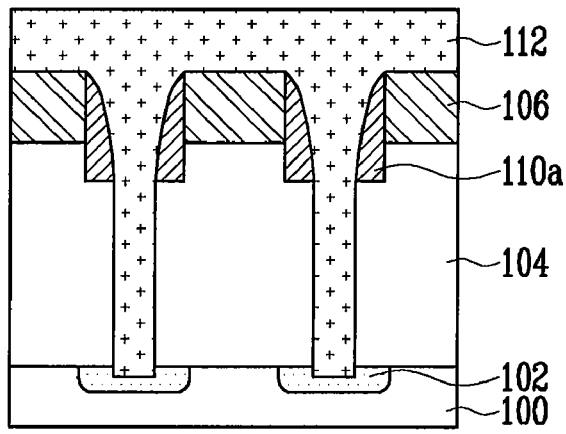

Referring to FIG. 1G, a material layer 112 for a contact plug is formed on the first hard mask 106 including the contact holes (refer to B of FIG. 1F), thus gap filling the contact holes (refer to B of FIG. 1F) with the material layer 112 for the contact plug. The material layer 112 for the contact plug may be formed from polysilicon or tungsten (W), or may have a stack film of polysilicon and W.

Figure 1H:
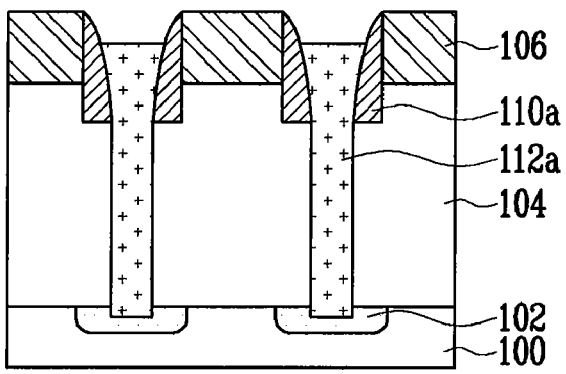

Referring to FIG. 1H, a polishing process or an etchback process, such as a Chemical Mechanical Polishing (CMP) method, is performed on the material layer to form the contact plug (refer to 112 of FIG. 1G). At this time, the top of the material layer is formed along the shape of the spacer 110a, so a width of the top of the material layer is wider than a width of the bottom of the material layer. The bottom of the contact plug 112a is brought in contact with the junction regions 102.

Meanwhile, the contact plug 112a may be formed 10 to 500 angstroms lower than the top of the first hard mask 106. The reason why the height of the contact plug 112a is lower than the top of the first hard mask 106 is that a distance between the contact plugs 112a, in particular, a distance between the tops of the contact plugs 112a is properly maintained.

Figure 1I:
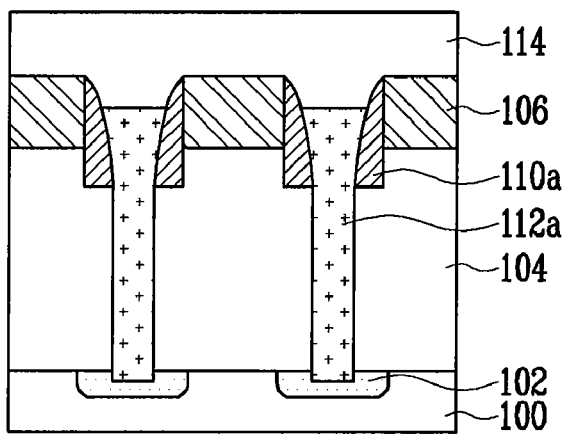

Referring to FIG. 1I, a second dielectric layer 114 for forming bit lines is formed on the first hard mask 106 including the contact plugs 112a.

Referring to FIG. 1J, damascene patterns C through which the contact plugs 112a are exposed are formed in the second dielectric layer 114. The damascene patterns C are used to form metal lines electrically connected to the tops of the contact plugs 112a by filling them with a conductive material. At this time, a position and width of the damascene pattern C may be identical to those of the top of the contact plug 112a. However, if miss alignment occurs, the position of the damascene pattern C may not be exactly identical to that of the top of the contact plug 112a. In this case, the spacers 110a formed on the sidewalls on an upper side of the contact plug 112a are exposed, and the damascene patterns C may be formed through self-alignment until the tops of the contact plugs 112a are exposed along the sidewalls of the spacer 110a. The spacer 110a has an etch selectivity different from that of the second dielectric layer 114 and is therefore not etched when the second dielectric layer 114 for forming the damascene patterns C is etched. Further, since the top width of the contact plug 112a is wider than the bottom width of the contact plug 112a, process margin can be increased when the damascene patterns C are formed on the contact plugs 112a.

As described above, according to the present invention, bit lines can be easily formed on contact plugs formed in narrow spaces with a high density. Accordingly, semiconductor devices with higher integration and reliability can be fabricated.

Although the foregoing description has been made with reference to the specific embodiment, it is to be understood that changes and modifications of the present invention may be made by the ordinary skilled in the art without departing from the spirit and scope of the present invention and appended claims.

What is claimed is:

1. A method of forming a contact plug of a semiconductor device, the method comprising:
    forming a first dielectric layer over a semiconductor substrate in which junction regions are formed;
    forming a hard mask over the first dielectric layer;
    etching selected regions of the hard mask and the first dielectric layer corresponding to the junction regions to form trenches;
    forming spacers on sidewalls of the trenches;
    forming contact holes in the first dielectric layer using an etch process employing the spacers and the hard mask so that the junction regions are exposed;
    forming contact plugs within the contact holes, wherein the contact plugs have a height lower than that of the hard mask;
    forming a second dielectric layer over the hard mask including the contact plugs; and
    removing a part of the second dielectric layer so that the contact plugs and at least one of the spacers are exposed, thereby forming damascene patterns.

2. The method of claim 1, wherein a bottom opening width of the spacer is narrower than a top opening width of the spacer.

3. The method of claim 1, wherein the spacer is formed using a nitride film.

4. The method of claim 1, wherein the spacer is formed using a Plasma Enhanced (PE) nitride film.

5. The method of claim 4, wherein the spacer is formed using a mixed gas of $SiH_4$ gas, $NH_3$ gas and $N_2$ gas as a source gas.

6. The method of claim 4, wherein the spacer is formed using RF power of 300 to 700 W in a temperature range of 400 to 600 degrees Celsius under a pressure of 3 to 10 Torr.

7. The method of claim 1, wherein the spacer is formed using a Low Pressure (LP) nitride film.

8. The method of claim 7, wherein the spacer is formed using a gas in which dichlorosilane gas (DCS) and $NH_3$ gas are mixed in a ratio of 5:1 to 20:1 as a source gas.

9. The method of claim 7, wherein the spacer is formed in a temperature range of 600 to 800 degrees Celsius under a pressure of 0.2 to 0.5 Torr.

10. The method of claim 1, wherein the formation of the spacer comprises:
    forming a spacer material layer over the hard mask including the trenches; and
    etching the spacer material layer so that the spacer material layer remains only on the sidewalls of the trenches.

11. The method of claim 10, wherein the spacer material layer is etched using an anisotropic etch process.

12. The method of claim 10, wherein the etch process of the spacer material layer is performed using a mixed gas of Ar gas, $CF_4$ gas and $CHF_3$ gas as an etch gas.

13. The method of claim 10, wherein the etch process of the spacer material layer is performed using power of 500 to 2000 W in a temperature range of 0 to 100 degrees Celsius under a pressure of 10 to 100 Torr.

14. The method of claim 1, wherein the contact hole is formed using a mixed gas of $C_xF_y$-based gas, Ar gas and $O_2$ gas as an etch gas.

15. The method of claim 1, wherein the contact hole is formed using power of 1000 to 4000 W in a temperature range of 0 to 100 degrees Celsius under a pressure of 10 to 100 Torr.

16. The method of claim 1, wherein the hard mask comprises a nitride film and an amorphous carbon layer.

17. The method of claim 16, wherein the amorphous carbon layer is removed after the contact holes are formed.

18. The method of claim 1, wherein the contact plug has a height, which is 10 to 500 angstrom lower than that of the hard mask.

* * * * *